(12) United States Patent
Li

(10) Patent No.: US 11,296,153 B2
(45) Date of Patent: Apr. 5, 2022

(54) OLED PIXEL STRUCTURE AND OLED DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Dongwei Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 215 days.

(21) Appl. No.: 16/622,392

(22) PCT Filed: Dec. 3, 2019

(86) PCT No.: PCT/CN2019/122692
§ 371 (c)(1),
(2) Date: Dec. 13, 2019

(87) PCT Pub. No.: WO2021/103057
PCT Pub. Date: Jun. 3, 2021

(65) Prior Publication Data
US 2021/0335890 A1      Oct. 28, 2021

(30) Foreign Application Priority Data
Nov. 26, 2019 (CN) .......................... 201911176917.6

(51) Int. Cl.
*H01L 27/32* (2006.01)
*G09G 3/20* (2006.01)
*G09G 3/3233* (2016.01)

(52) U.S. Cl.
CPC ......... *H01L 27/322* (2013.01); *G09G 3/2003* (2013.01); *G09G 3/3233* (2013.01);
(Continued)

(58) Field of Classification Search
CPC ............. H01L 51/5209; H01L 27/3262; H01L 27/3258; H01L 27/3248; H01L 51/5225
See application file for complete search history.

(56) References Cited

U.S. PATENT DOCUMENTS 10,439,157 B2 * 10/2019 Sakamoto ........... H01L 51/5221
2003/0011584 A1 *  1/2003 Azami ................. G09G 3/3266
                                                              345/204
(Continued)

FOREIGN PATENT DOCUMENTS

CN       108511612 A      9/2018
KR       20190070770 A    6/2019

*Primary Examiner* — Shaheda A Abdin
(74) *Attorney, Agent, or Firm* — Osha Bergman Watanabe & Burton LLP

(57) ABSTRACT

The present disclosure provides an organic light emitting diode pixel structure and an organic light emitting diode display panel including the same. The organic light emitting diode pixel structure includes a driving circuit layer, a light emitting function layer, and a color resist layer. The driving circuit layer includes pixel driving circuits. The color resist layer includes color resists arranged in an array. The pixel driving circuits are disposed in interval regions outside long sides of the color resists. Because size of the pixel driving circuits is much larger than a width of traces, each width between adjacent pixels is increased. This avoids light leakage caused by pixel intervals being too small.

20 Claims, 5 Drawing Sheets

(52) U.S. Cl.
CPC ...... *H01L 27/3246* (2013.01); *H01L 27/3265* (2013.01); *H01L 27/3272* (2013.01); *G09G 2300/0452* (2013.01); *G09G 2300/0842* (2013.01); *G09G 2320/0242* (2013.01)

(56) References Cited

U.S. PATENT DOCUMENTS

| | | | |
|---|---|---|---|
| 2006/0066599 A1* | 3/2006 | Chui | G09G 3/3466 345/204 |
| 2007/0018920 A1* | 1/2007 | Jo | G09G 3/3607 345/88 |
| 2008/0074360 A1* | 3/2008 | Lu | G09G 3/3233 345/77 |
| 2017/0038648 A1* | 2/2017 | Liu | H01L 27/1222 |

* cited by examiner

_US 11,296,153 B2_

OLED PIXEL STRUCTURE AND OLED DISPLAY PANEL

FIELD OF INVENTION

The present disclosure relates to a field of display technology, and particularly to an OLED pixel structure and an OLED display panel.

BACKGROUND

In current large-size active matrix organic light emitting diode (AMOLED) display panels, pixels usually adopt white-color OLEDs with red, green, and blue color resists to emit different color lights.

However, pixel intervals of current AMOLED display panels are usually only about ten micrometers, and such small pixel intervals causes a certain degree of light leakage. Therefore, it is necessary to solve a problem that pixel intervals of current AMOLED display panels are too small.

SUMMARY OF DISCLOSURE

The present disclosure provides an OLED pixel structure to solve the problem that pixel intervals of current AMOLED display panels are too small.

In order to solve the problem, the present disclosure provides the following solutions.

The present disclosure provides an organic light emitting diode pixel structure comprising:
- a driving circuit layer having pixel driving circuits for driving pixels to emit light;
- a light emitting function layer disposed on the driving circuit layer and comprising a pixel electrode layer, a pixel defining layer, a light emitting material layer, and a common electrode layer which are sequentially stacked; and
- a color resist layer comprising red, green, and blue color resists arranged in an array, wherein each color resist comprises two opposite long sides and two opposite short sides;
- wherein the pixel driving circuits are disposed in interval regions outside the long sides of the color resists.

In an embodiment, each pixel driving circuit is disposed in the interval region outside a left long side of the corresponding color resist.

In an embodiment, each pixel driving circuit is disposed in the interval region outside a right long side of the corresponding color resist.

In an embodiment, the short sides are straight lines.

In an embodiment, the short sides are convex arcs.

In an embodiment, a width of the interval region between two adjacent long sides of the color resists is 30 μm to 60 μm.

In an embodiment, a width of the interval region between two adjacent short sides of the color resists is 20 μm to 40 μm.

In an embodiment, the color resist layer is disposed between the driving circuit layer and the light emitting function layer.

In an embodiment, the color resist layer is disposed on a side of the light emitting function layer away from the driving circuit layer.

In an embodiment, each pixel driving circuit comprises a first thin film transistor, a second thin film transistor, a third thin film transistor, a storage capacitor, and a light emitting diode; a source electrode of the first thin film transistor is connected to a first electrode of the storage capacitor, and a gate electrode of the third thin film transistor; and a second electrode of the storage capacitor is connected to a source electrode of the second thin film transistor, a source electrode of the third thin film transistor, and an anode electrode of the light emitting diode.

The present disclosure provides an organic light emitting diode display panel comprising an organic light emitting diode pixel structure. The organic light emitting diode pixel structure comprises:
- a driving circuit layer having pixel driving circuits for driving pixels to emit light;
- a light emitting function layer disposed on the driving circuit layer and comprising a pixel electrode layer, a pixel defining layer, a light emitting material layer, and a common electrode layer which are sequentially stacked; and
- a color resist layer comprising red, green, and blue color resists arranged in an array, wherein each color resist comprises two opposite long sides and two opposite short sides;
- wherein the pixel driving circuits are disposed in interval regions outside the long sides of the color resists.

In an embodiment, each pixel driving circuit is disposed in the interval region outside a left long side of the corresponding color resist.

In an embodiment, each pixel driving circuit is disposed in the interval region outside a right long side of the corresponding color resist.

In an embodiment, the short sides are straight lines.

In an embodiment, the short sides are convex arcs.

In an embodiment, a width of the interval region between two adjacent long sides of the color resists is 30 μm to 60 μm.

In an embodiment, a width of the interval region between two adjacent short sides of the color resists is 20 μm to 40 μm.

In an embodiment, the color resist layer is disposed between the driving circuit layer and the light emitting function layer.

In an embodiment, wherein the color resist layer is disposed on a side of the light emitting function layer away from the driving circuit layer.

In an embodiment, each pixel driving circuit comprises a first thin film transistor, a second thin film transistor, a third thin film transistor, a storage capacitor, and a light emitting diode; a source electrode of the first thin film transistor is connected to a first electrode of the storage capacitor, and a gate electrode of the third thin film transistor; and a second electrode of the storage capacitor is connected to a source electrode of the second thin film transistor, a source electrode of the third thin film transistor, and an anode electrode of the light emitting diode.

The present disclosure provides an organic light emitting diode pixel structure and an organic light emitting diode display panel comprising the same. The organic light emitting diode pixel structure comprises a driving circuit layer, a light emitting function layer, and a color resist layer. The driving circuit layer has pixel driving circuits. The color resist layer comprises red, green, and blue color resists arranged in an array. The pixel driving circuits are disposed in interval regions outside long sides of the color resists. Because size of the pixel driving circuits is much larger than a width of traces, a width of each interval region between adjacent pixels is increased by disposing the pixel driving circuits in the interval regions outside the long sides of the color resists. This avoids light leakage caused by pixel intervals being too small.

BRIEF DESCRIPTION OF DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
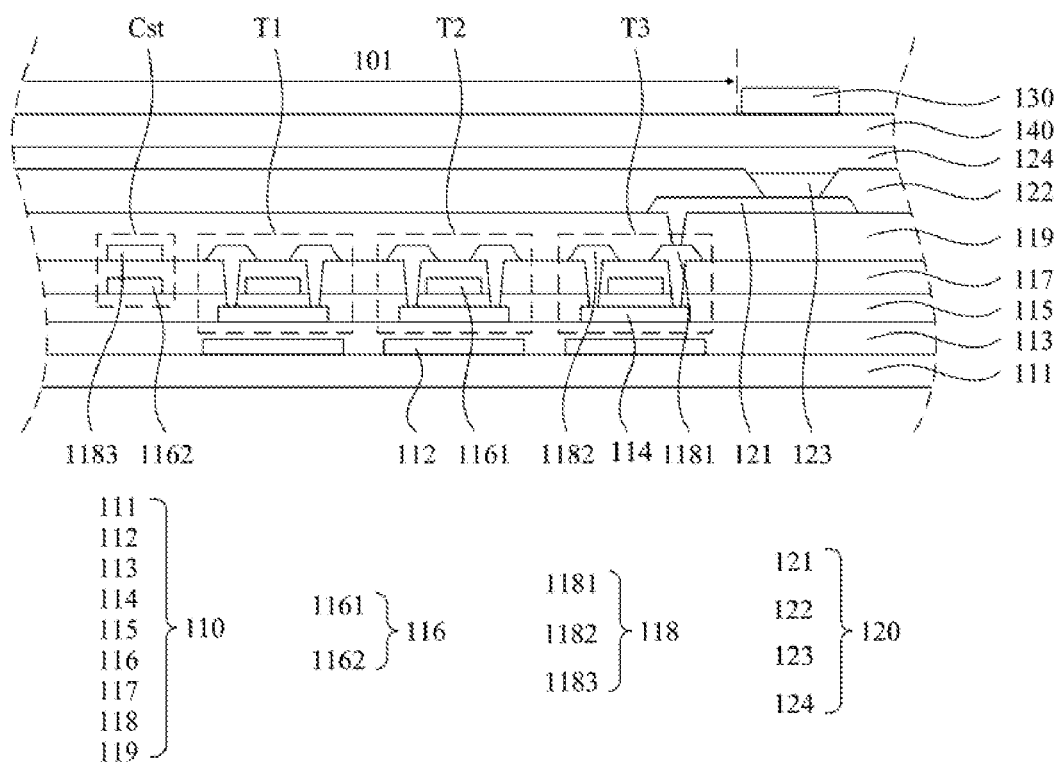
FIG. 1 is a structural schematic diagram of a first type of an organic light emitting diode pixel structure according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structure are indicated by the same reference numerals.

The present disclosure provides an organic light emitting diode pixel structure which can solve the problem that pixel intervals of current AMOLED display panels are too small.

As shown in FIG. 1 to FIG. 4, the present disclosure provides an organic light emitting diode pixel structure comprising:
a driving circuit layer 110 having pixel driving circuits for driving pixels to emit light;
a light emitting function layer 120 disposed on the driving circuit layer 110 and comprising a pixel electrode layer 121, a pixel defining layer 122, a light emitting material layer 123, and a common electrode layer 124 which are sequentially stacked; and
a color resist layer 130 comprising red color resists 131, green color resists 132, and blue color resists 133 arranged in an array, wherein each color resist comprises two opposite long sides and two opposite short sides;
wherein the pixel driving circuits are disposed in interval regions 101 outside the long sides of the color resists.

The present disclosure provides an organic light emitting diode pixel structure comprising a driving circuit layer, a light emitting function layer, and a color resist layer. The driving circuit layer has pixel driving circuits. The color resist layer comprises red, green, and blue color resists arranged in an array. The pixel driving circuits are disposed in interval regions outside long sides of the color resists. Because size of the pixel driving circuits is much larger than a width of traces, a width of each interval region between adjacent pixels is increased by disposing the pixel driving circuits in the interval regions outside the long sides of the color resists. This avoids light leakage caused by pixel intervals being too small.

The organic light emitting diode pixel structure comprises a plurality of sub-pixel structures arranged in an array. The organic light emitting diode pixel structure will be described in detail below with a single sub-pixel in conjunction with specific embodiments.

In an embodiment, the organic light emitting diode pixel structure is top-emitting, as shown in FIG. 1. FIG. 1 is a structural schematic diagram of a first type of an organic light emitting diode pixel structure according to an embodiment of the present disclosure. The organic light emitting diode pixel structure comprises:
a driving circuit layer 110 comprising a substrate 111, a light shielding layer 112, a buffer layer 113, an active layer 114, a gate insulating layer 115, a gate electrode layer 116, and an interlayer insulating layer 117, a source/drain layer 118, and a passivation layer 119 which are sequentially stacked from bottom to top;
a light emitting function layer 120 disposed on the driving circuit layer 110 and comprising a pixel electrode layer 121, a pixel defining layer 122, a light emitting material layer 123, and a common electrode layer 124 which are sequentially stacked from bottom to top; and
a color resist layer 130 disposed on the light emitting function layer 120.

The driving circuit layer 110 comprises first thin film transistors T1, second, thin film transistors T2, third thin film transistors T3, and storage capacitors Cst which compose pixel driving circuits. The pixel driving circuits are disposed in interval regions 101 outside the color resist layer 130.

The driving circuit layer 110 specifically comprises:
A substrate 111. The substrate 111 may be a glass substrate or a flexible substrate. The glass substrate is composed of aluminosilicate and other components. The flexible substrate usually comprises a first flexible substrate, a second flexible substrate, and an inorganic layer disposed between the first flexible substrate and the second flexible substrate. The first flexible substrate and the second flexible substrate are usually composed of an organic polymer such as polyacetamide or polyethylene terephthalate for ensuring flexibility of the flexible substrates. The inorganic layer is usually composed of silicon nitride or silicon oxide for blocking water or oxygen outside the substrate from entering the thin film transistors.

A light shielding layer 112. The light shielding layer 112 is configured to shield backlight. This prevents a problem that the active layer is exposed to strong light to generate photo-generated carriers, thereby causing photo-electric leakage and resulting in an increase in leakage current of device. The light shielding layer 112 is usually composed of a light shielding material such as single crystal silicon or metal. Preferably, the light shielding layer 112 is composed of molybdenum.

A buffer layer 113. The buffer layer 113 is disposed on the light shielding layer 112 and covers the light shielding layer 112 and the substrate 111 for preventing impurities in the substrate 111 from diffusing into the thin film transistors during a thermal process, thereby reducing leakage current. The buffer layer 113 is composed of stacked silicon nitride/silicon oxide. Silicon nitride has good ion barrier capability and good water oxygen barrier capability. Wettability of an interface between silicon oxide and polycrystalline silicon is good.

An active layer 114. The active layer 114 is disposed on the buffer layer 113 and patterned to form active areas of the thin film transistors. Each active area comprises a channel area and doped areas at both ends of the channel area.

A gate insulating layer 115. The gate insulating layer 115 is disposed on the active layer 114 and covers the active layer 114 and the buffer layer 113. The gate insulating layer is usually composed of stacked silicon oxide/silicon nitride. Silicon nitride has a high breakdown voltage and can be used as a good gate insulating material. The silicon oxide and polysilicon have good grain boundary matching and stress matching. Furthermore, silicon oxide has good step coverage.

A gate electrode layer 116. The gate electrode layer 116 is disposed on the gate insulating layer 115 and patterned to form gate electrodes 1161 of the thin film transistors, a first electrode 1162 of the storage capacitor Cst, and gate signal lines (not shown). The gate electrode layer 116 is usually composed of molybdenum, aluminum, or an aluminum alloy.

An interlayer insulating layer 117. The interlayer insulating layer 117 is disposed on the gate electrode layer 116 and covers the gate electrode layer 116 and the gate insulating layer 115. Similar to the gate insulating layer 115, the interlayer insulating layer 117 is also usually composed of stacked silicon oxide/silicon nitride.

A source/drain layer 118. The source/drain layer 118 is disposed on the interlayer insulating layer 117 and patterned to form source electrodes 1181 and drain electrodes 1182 of the thin film transistors, a second electrode 1183 of the storage capacitor Cst, and source/drain signal lines (not shown). The source electrodes and drain electrodes are respectively connected to the active areas through via holes. The source/drain layer 118 is composed of stacked titanium/aluminum/titanium or molybdenum/aluminum/molybdenum.

A passivation layer 119. The passivation layer 119 is disposed on the source/drain layer 118 and covers the source/drain layer 118 and the interlayer insulating layer 117. The passivation layer 119 is usually composed of silicon nitride.

The light emitting function layer 120 specifically comprises:

A pixel electrode layer 121. The pixel electrode layer 121 is disposed on the passivation layer 119 and patterned to form a pixel electrode. The pixel electrode is connected to the source electrode of the third thin film transistor T3 through a via hole in the passivation layer 119. The pixel electrode layer 121 is usually composed of indium tin oxide, metallic silver or graphene.

A pixel defining layer 122. The pixel defining layer 122 is disposed on the pixel electrode layer 121 and patterned to form a pixel defining region for defining a pixel region.

A light emitting material layer 123. The light emitting material layer 123 is disposed in the pixel defining region. In the embodiments of present disclosure, the light emitting material layer is a white light emitting material layer. The light emitting material layer 123 may be a single-layer light emitting material layer formed by mixing light emitting materials of different colors, or a multi-layer light emitting material layer formed by stacking light emitting materials of different colors.

A common electrode layer 124. The common electrode layer 124 is disposed on the light emitting material layer 123 to connect and cover the light emitting material layer 123. Since the pixel structure provided in this embodiment is top-emitting, light needs to penetrate the common electrode layer 124. Therefore, the common electrode layer 124 is composed of a transparent material such as indium tin oxide.

A barrier layer 140 is disposed on the common electrode layer 124. The barrier layer 140 is usually a single layer structure of silicon nitride or silicon oxide, or a stacked structure of silicon nitride/silicon oxide.

Figure 3:
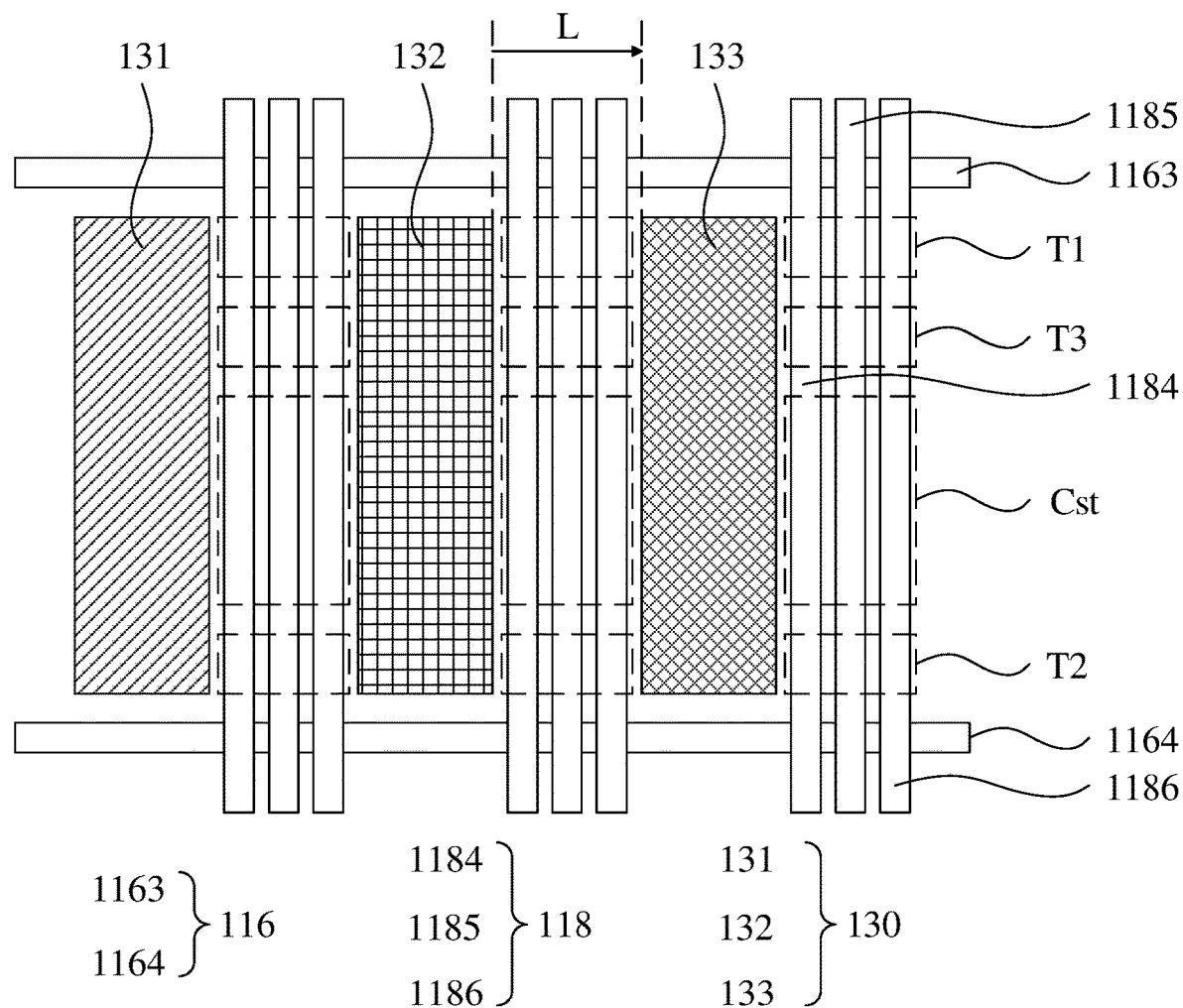
FIG. 3 is a schematic diagram of a first type of a planar stack of a gate electrode layer, a source/drain electrode layer, and a color resist layer according to an embodiment of the present disclosure.
Figure 4:
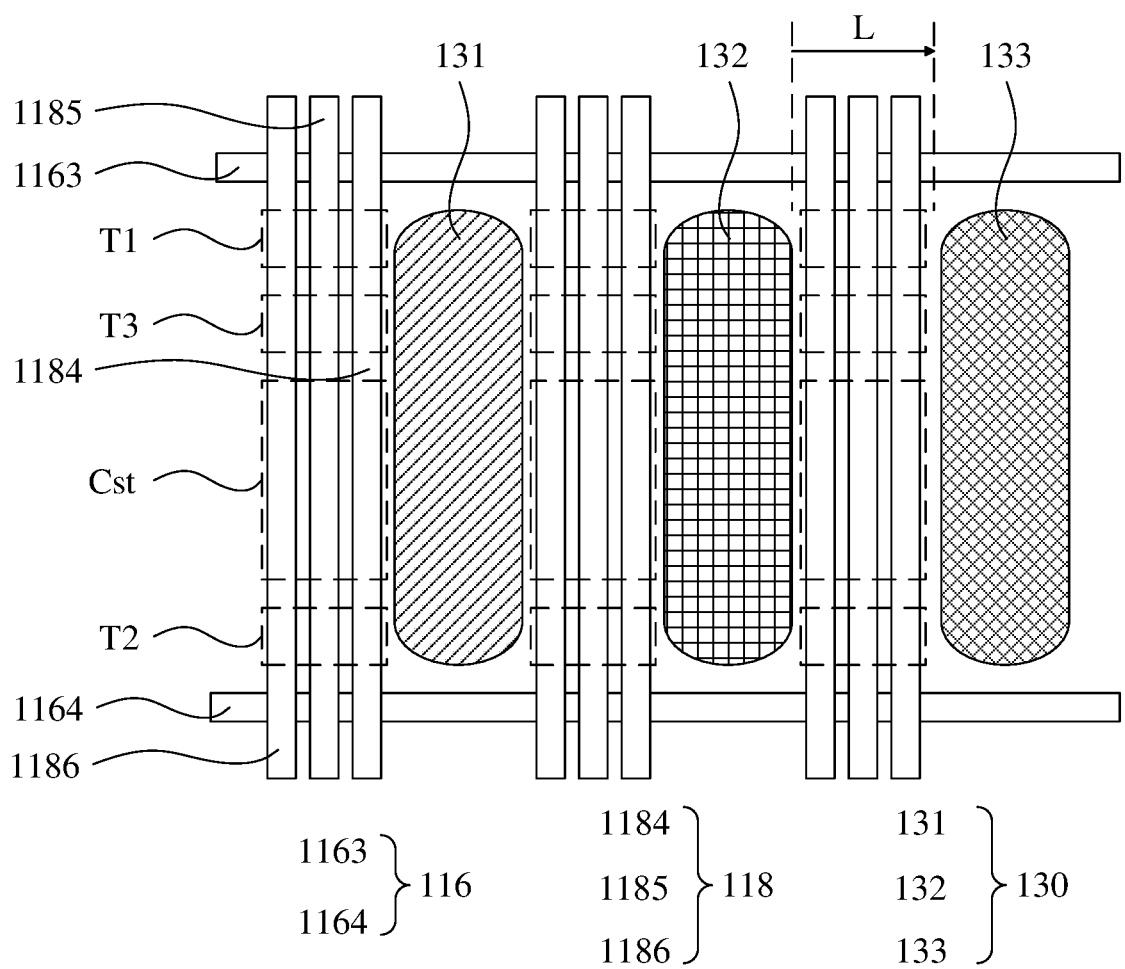
FIG. 4 is a schematic diagram of a second type of a planar stack of a gate electrode layer, a source/drain electrode layer, and a color resist layer according to an embodiment of the present disclosure.

The color resist layer 130 is disposed on the barrier layer 140 and corresponds to the light emitting material layer 123. As shown in FIG. 3 and FIG. 4, the color resist layer 130 is patterned to form red color resists 131, green color resists 132, and blue color resists 133 which are arranged in an array.

Figure 2:
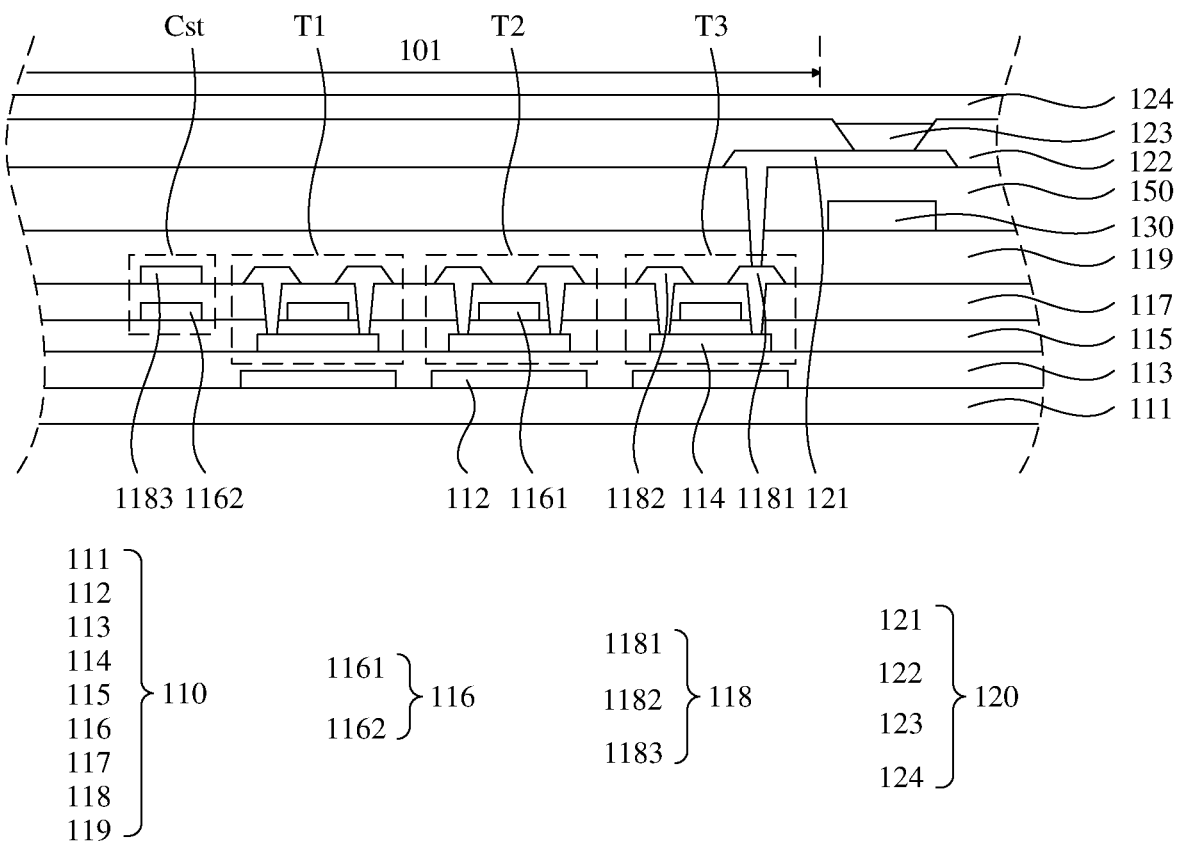
FIG. 2 is a structural schematic diagram of a second type of an organic light emitting diode pixel structure according to an embodiment of the present disclosure.

In another embodiment, the organic light emitting diode pixel structure is bottom-emitting, as shown in FIG. 2. FIG. 2 is a structural schematic diagram of a second type of an organic light emitting diode pixel structure according to an embodiment of the present disclosure. The organic light emitting diode pixel structure comprises:

a driving circuit layer 110 comprising a substrate 111, a light shielding layer 112, a buffer layer 113, an active layer 114, a gate insulating layer 115, a gate electrode layer 116, and an interlayer insulating layer 117, a source/drain layer 118, and a passivation layer 119 which are sequentially stacked from bottom to top;
  a color resist layer 130 disposed on the driving circuit layer 110;
  a planarization layer 150 disposed on the color resist layer 130 and covering the color resist layer 130 and the light emitting function layer 120 for planarizing the color resist layer 130; and
  a light emitting function layer 120 disposed on the planarization layer 150 and comprising a pixel electrode layer 121, a pixel defining layer 122, a light emitting material layer 123, and a common electrode layer 124 which are sequentially stacked from bottom to top.

The driving circuit layer 110 comprises first thin film transistors T1, second thin film transistors T2, third thin film transistors T3, and storage capacitors Cst which compose pixel driving circuits. The pixel driving circuits are disposed in interval regions 101 outside the color resist layer 130.

Structures of the driving circuit layer 110, the pixel defining layer 122, the light emitting material layer 123, and the color resist layer 130 provided in this embodiment are respectively similar to structures of the driving circuit layer 110, the pixel defining layer 122, the light emitting material layer 123, and the color resist layer 130 provided in the embodiment shown in FIG. 1. For details, refer to the foregoing embodiment, and details are not described herein again.

In this embodiment, the planarization layer 150 is disposed on the color resist layer 130 and covering the color resist layer 130 and the passivation layer 119 for planarizing the color resist layer 130 to provide a flat substrate for subsequent fabrication of the pixel structure. The planarization layer 150 is usually composed of polyimide (PI), polyethylene terephthalate (PET) or other organic materials.

The pixel electrode layer 121 is disposed on the planarization layer 150 and patterned to form a pixel electrode. The pixel electrode is connected to the source electrode of the third thin film transistor T3 through a via hole penetrating planarization layer 150 and the passivation layer 119. Since the pixel structure provided in this embodiment is bottom-emitting, light needs to penetrate the pixel electrode layer 121. Therefore, the pixel electrode layer 121 is composed of a transparent material such as indium tin oxide.

The common electrode layer 124 is disposed on the light emitting material layer 123 to connect and cover the light emitting material layer 123. The common electrode layer 124 is generally composed of one or more metals such as ytterbium (Yb), calcium (Ca), magnesium (Mg), and silver (Ag), or an alloy thereof.

Please refer to FIG. 3, which is a schematic diagram of a first type of a planar stack of a gate electrode layer, a source/drain electrode layer, and a color resist layer according to an embodiment of the present disclosure (some structures are not shown).

The color resist layer 130 comprises red color resists 131, green color resists 132, and blue color resists 133. The red color resists 131, the green color resists 132, and the blue color resists 133 have a same shape which comprises two opposite long sides and two opposite short sides. The two opposite long sides and the two opposite short sides are straight lines and together form a rectangular color resist pattern.

The gate electrode layer 116 is patterned to form write signal lines 1163 and read signal lines 1164. The write signal lines 1163 and the read signal lines 1164 are respectively disposed in interval regions outside the short sides of the color resists. A width of the interval region between two adjacent short sides of the color resists is 20 µm to 40 µm.

The source/drain layer 118 is patterned to form sensing signal lines 1184, power signal lines 1185, and data signal lines 1186 which are parallel to each other. Each of the sensing signal line 1184, each of the power signal line 1185, and each of the data signal line 1186 are disposed together in each of the interval regions outside right long sides of the color resists. In another embodiment, please refer to FIG. 4, each of the sensing signal line 1184, each of the power signal line 1185, and each of the data signal line 1186 are disposed together in each of the interval regions outside left long sides of the color resists. In other embodiments, each of the sensing signal line 1184, each of the power signal line 1185, and each of the data signal line 1186 may be separately disposed in the two interval regions outside the right long side and the left long side of each of the color resists, which is not limited herein.

Each of pixel driving circuits comprises a first thin film transistor T1, a second thin film transistor T2, a third thin film transistor T3, and a storage capacitor Cst which are disposed in each of the interval regions outside the right long sides of the color resists.

In this embodiment, because sizes of the first thin film transistors and the storage capacitor of each pixel driving circuit are much larger than widths of signal traces, a width of each interval region between adjacent color resists is increased by disposing the pixel driving circuits in the interval regions outside the long sides of the color resists. This avoids light leakage caused by pixel intervals being too small. A width L of each interval region between two adjacent long sides of the color resists is 30 µm to 60 µm.

Furthermore, in this embodiment, the color resists are shaped as rectangles to ensure that pixel aperture ratio of the pixel structure is as large as possible.

Please refer to FIG. 4, which is a schematic diagram of a second type of a planar stack of a gate electrode layer, a source/drain electrode layer, and a color resist layer according to an embodiment of the present disclosure.

The color resist layer 130 comprises red color resists 131, green color resists 132, and blue color resists 133. The red color resists 131, the green color resists 132, and the blue color resists 133 have a same shape which comprises two opposite long sides and two opposite short sides. The two opposite long sides are straight lines, and the two opposite short sides are convex arcs. The two opposite long sides and the two opposite short sides together form a color resist pattern similar to an ellipsoid.

The gate electrode layer 116 is patterned to form write signal lines 1163 and read signal lines 1164. The write signal lines 1163 and the read signal lines 1164 are respectively disposed in interval regions outside the short sides of the color resists. A width of the interval region between two adjacent short sides of the color resists is 20 µm to 40 µm.

The source/drain layer 118 is patterned to form sensing signal lines 1184, power signal lines 1185, and data signal lines 1186 which are parallel to each other. Each of the sensing signal line 1184, each of the power signal line 1185, and each of the data signal line 1186 are disposed together in each of the interval regions outside left long sides of the color resists. In another embodiment, please refer to FIG. 3, each of the sensing signal line 1184, each of the power signal line 1185, and each of the data signal line 1186 are disposed together in each of the interval regions outside right long sides of the color resists. In other embodiments, each of the sensing signal line 1184, each of the power signal line 1185, and each of the data signal line 1186 may be separately disposed in the two interval regions outside the right long side and the left long side of each of the color resists, which is not limited herein.

Each of pixel driving circuits comprises a first thin film transistor T1, a second thin film transistor T2, a third thin film transistor T3, and a storage capacitor Cst which are disposed in each of the interval regions outside the left long sides of the color resists.

In this embodiment, because sizes of the first thin film transistors and the storage capacitor of each pixel driving circuit are much larger than widths of signal traces, a width of each interval region between adjacent color resists is increased by disposing the pixel driving circuits in the interval regions outside the long sides of the color resists. This avoids light leakage caused by pixel intervals being too small. A width L of each interval region between two adjacent long sides of the color resists is 30 µm to 60 µm.

Furthermore, in this embodiment, the color resists are shaped as ellipsoid-like shapes, so that film formation uniformity of the color resists is better in a process of fabricating the color resists, which is advantageous for display uniformity of a display panel.

Figure 5:
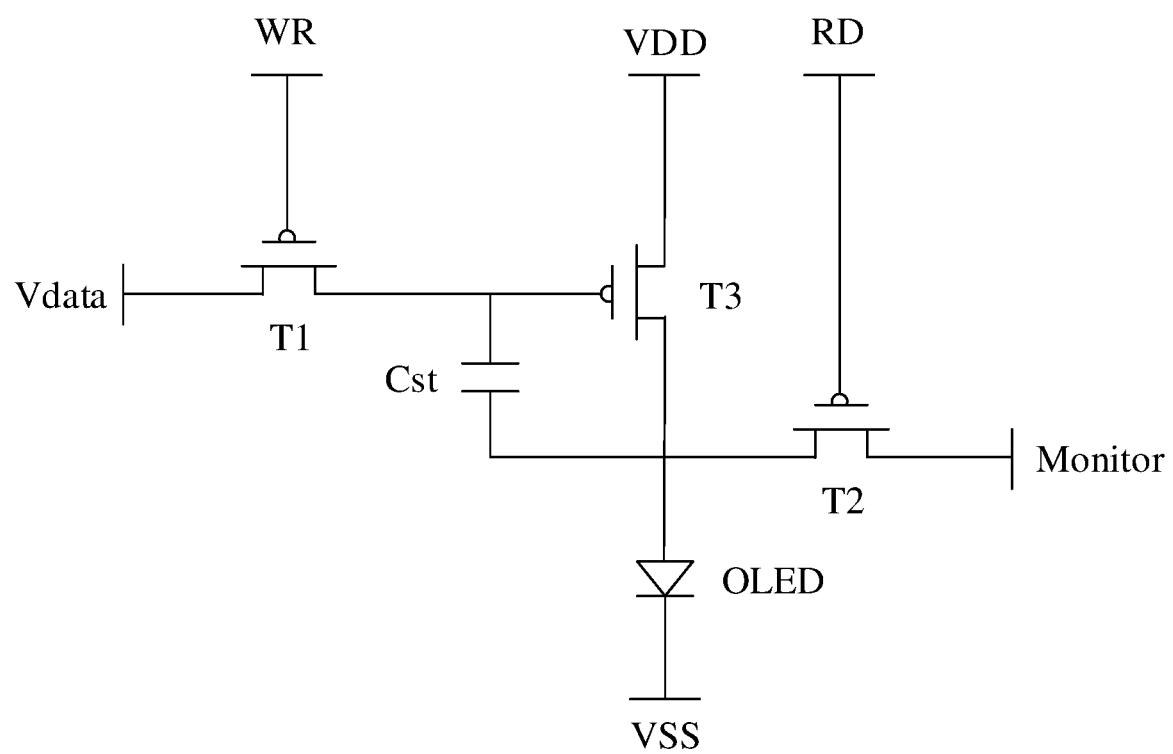
FIG. 5 is a schematic diagram of a pixel driving circuit according to an embodiment of the present disclosure.

The organic light emitting diode pixel structure comprises a plurality of sub-pixel structures arranged in an array. Each sub-pixel structure comprises a pixel driving circuit. Please refer to FIG. 5, which is a schematic diagram of a pixel driving circuit according to an embodiment of the present disclosure (some structures are not shown). Each pixel driving circuit comprises a first thin film transistor T1, a second thin film transistor T2, a third thin film transistor T3, a storage capacitor Cst, and an organic light emitting diode organic light emitting diode.

A source electrode of the first thin film transistor T1 is connected to a first electrode of the storage capacitor Cst, and a gate electrode of the third thin film transistor T3. A second electrode of the storage capacitor Cst is connected to a source electrode of the second thin film transistor T2, a source electrode of the third thin film transistor T3, and an anode electrode of the light emitting diode organic light emitting diode.

A gate electrode of the first thin film transistor T1 is connected to a write signal line WR. A drain electrode of the first thin film transistor T1 is connected to a data signal line Vdata. A gate electrode of the second thin film transistor T2 is connected to a read signal line RD. A drain electrode of the second thin film transistor T2 is connected to a sensing signal line Monitor. A drain electrode of the third thin film transistor T3 is connected to a power supply signal line VDD. A cathode electrode of the organic light emitting diode organic light emitting diode is connected to a ground signal line VSS.

The third thin film transistor T3 is a driving transistor for driving the organic light emitting diode organic light emitting diode to emit light. The first thin film transistor T1 is a switching transistor for charging the gate electrode of the driving transistor T3, thereby switching the pixel circuit. The second thin film transistor T2 is a compensation transistor for circuit compensation of the driving transistor T3. The storage capacitor Cst is configured to store gate electrode potential of the third thin film transistor T3 such that when the switching transistor T1 is turned off, the gate electrode of the driving transistor T3 is still at original potential.

The present disclosure provides an AMOLED display panel comprising an organic light emitting diode pixel structure. The organic light emitting diode pixel structure comprises;
- a driving circuit layer having pixel driving circuits for driving pixels to emit light;
- a light emitting function layer disposed on the driving circuit layer and comprising a pixel electrode layer, a pixel defining layer, a light emitting material layer, and a common electrode layer which are sequentially stacked; and
- a color resist layer comprising red, green, and blue color resists arranged in an array, wherein each color resist comprises two opposite long sides and two opposite short sides;
- wherein the pixel driving circuits are disposed in interval regions outside the long sides of the color resists.

In an embodiment, each, pixel driving circuit is disposed in the interval region outside a left long side of the corresponding color resist.

In an embodiment, each pixel driving circuit is disposed in the interval region outside a right long side of the corresponding color resist.

In an embodiment, the short sides are straight lines.

In an embodiment, the short sides are convex arcs.

In an embodiment, a width of the interval region between two adjacent long sides of the color resists is 30 μm to 60 μm.

In an embodiment, a width of the interval region between two adjacent short sides of the color resists is 20 μm to 40 μm.

In an embodiment, the color resist layer is disposed between the driving circuit layer and the light emitting function layer.

In an embodiment, wherein the color resist layer is disposed on a side of the light emitting function layer away from the driving circuit layer.

In an embodiment, each pixel driving circuit comprises a first thin film transistor, a second thin film transistor, a third thin film transistor, a storage capacitor, and a light emitting diode; a source electrode of the first thin film transistor is connected to a first electrode of the storage capacitor, and a gate electrode of the third thin film transistor; and a second electrode of the storage capacitor is connected to a source electrode of the second thin film transistor, a source electrode of the third thin film transistor, and an anode electrode of the light emitting diode.

The present disclosure provides an organic light emitting diode pixel structure and an organic light emitting diode display panel comprising the same. The organic light emitting diode pixel structure comprises a driving circuit layer, a light emitting function layer, and a color resist layer. The driving circuit layer has pixel driving circuits. The color resist layer comprises red, green, and blue color resists arranged in an array. The pixel driving circuits are disposed in interval regions outside long sides of the color resists. Because size of the pixel driving circuits is much larger than a width of traces, a width of each interval region between adjacent pixels is increased by disposing the pixel driving circuits in the interval regions outside the long sides of the color resists. This avoids light leakage caused by pixel intervals being too small.

In the above, the present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. An organic light emitting diode pixel structure, comprising a plurality of sub-pixel structures arranged in an array, and further comprising:
    a color resist layer comprising a plurality of color resists arranged in an array, wherein each of the color resists corresponds to one sub-pixel structure and comprises two opposite long sides and two opposite short sides; and
    a driving circuit layer comprising a plurality of pixel driving circuits, a plurality of sensing signal lines, a plurality of power signal lines, and a plurality of data signal lines, wherein
    each of the pixel driving circuits is configured for driving one sub-pixel structure to emit light and comprises a first thin film transistor, a second thin film transistor, a third thin film transistor, and a storage capacitor that are arranged in a column in a direction parallel to the long sides in an interval region between one long side of one corresponding color resist and one adjacent long side of one adjacent color resist in a direction parallel to the short sides; and
    each of the pixel driving circuits is electrically connected to one sensing signal line, one power signal line, and one data signal line that are arranged in the interval region and parallel to the long sides.

2. The organic light emitting diode pixel structure according to claim 1, wherein each pixel driving circuit is disposed in the interval region near a left long side of the corresponding color resist.

3. The organic light emitting diode pixel structure according to claim 1, wherein each pixel driving circuit is disposed in the interval region near a right long side of the corresponding color resist.

4. The organic light emitting diode pixel structure according to claim 1, wherein the short sides are straight lines.

5. The organic light emitting diode pixel structure according to claim 1, wherein the short sides are convex arcs.

6. The organic light emitting diode pixel structure according to claim 1, wherein a width of the interval region in the direction parallel to the short sides is 30 μm to 60 μm.

7. The organic light emitting diode pixel structure according to claim 1, wherein a width of a space between one short side of one corresponding color resist and one adjacent short side of one adjacent color resist in the direction parallel to the long sides is 20 μm to 40 μm.

8. The organic light emitting diode pixel structure according to claim 1, further comprising:
a light emitting function layer disposed on the driving circuit layer, wherein the color resist layer is disposed between the driving circuit layer and the light emitting function layer.

9. The organic light emitting diode pixel structure according to claim 1, further comprising:
a light emitting function layer disposed on the driving circuit layer, wherein the color resist layer is disposed on a side of the light emitting function layer away from the driving circuit layer.

10. The organic light emitting diode pixel structure according to claim 1, wherein a source electrode of the first thin film transistor is electrically connected to a first electrode of the storage capacitor and a gate electrode of the third thin film transistor, and a second electrode of the storage capacitor is electrically connected to a source electrode of the second thin film transistor and a source electrode of the third thin film transistor.

11. An organic light emitting diode display panel, comprising an organic light emitting diode pixel structure, wherein the organic light emitting diode pixel structure comprises a plurality of sub-pixel structures arranged in an array and further comprises:
a color resist layer comprising a plurality of color resists arranged in an array, wherein each of the color resists corresponds to one sub-pixel structure and comprises two opposite long sides and two opposite short sides; and
a driving circuit layer comprising a plurality of pixel driving circuits, a plurality of sensing signal lines, a plurality of power signal lines, and a plurality of data signal lines, wherein
each of the pixel driving circuits is configured for driving one sub-pixel structure to emit light and comprises a first thin film transistor, a second thin film transistor, a third thin film transistor, and a storage capacitor that are arranged in a column in a direction parallel to the long sides in an interval region between one long side of one corresponding color resist and one adjacent long side of one adjacent color resist in a direction parallel to the short sides; and
each of the pixel driving circuits is electrically connected to one sensing signal line, one power signal line, and one data signal line that are arranged in the interval region and parallel to the long sides.

12. The organic light emitting diode display panel according to claim 11, wherein each pixel driving circuit is disposed in the interval region near a left long side of the corresponding color resist.

13. The organic light emitting diode display panel according to claim 11, wherein each pixel driving circuit is disposed in the interval region near a right long side of the corresponding color resist.

14. The organic light emitting diode display panel according to claim 11, wherein the short sides are straight lines.

15. The organic light emitting diode display panel according to claim 11, wherein the short sides are convex arcs.

16. The organic light emitting diode display panel according to claim 11, wherein a width of the interval region between two adjacent long sides of the color resists in the direction parallel to the short sides is 30 μm to 60 m.

17. The organic light emitting diode display panel according to claim 11, wherein a width of a space between one short side of one corresponding color resist and one adjacent short side of one adjacent color resist in the direction parallel to the long sides is 20 μm to 40 μm.

18. The organic light emitting diode display panel according to claim 11, further comprising:
a light emitting function layer disposed on the driving circuit layer, wherein the color resist layer is disposed between the driving circuit layer and the light emitting function layer.

19. The organic light emitting diode display panel according to claim 11, further comprising:
a light emitting function layer disposed on the driving circuit layer, wherein the color resist layer is disposed on a side of the light emitting function layer away from the driving circuit layer.

20. The organic light emitting diode display panel according to claim 11, wherein a source electrode of the first thin film transistor is electrically connected to a first electrode of the storage capacitor and a gate electrode of the third thin film transistor, and a second electrode of the storage capacitor is electrically connected to a source electrode of the second thin film transistor and a source electrode of the third thin film transistor.

* * * * *